(12) United States Patent
De La Prieta et al.

(10) Patent No.: US 7,084,350 B2
(45) Date of Patent: Aug. 1, 2006

(54) GREEN CERAMIC INSERT, CERAMIC INSERT, CERAMIC GREEN BODY OR GREEN BODY COMPOSITE AND CERAMIC LAMINATED COMPOSITE PRODUCED THEREBY

(75) Inventors: Claudio De La Prieta, Stuttgart (DE); Andreas Hachtel, Leinfelden-Echterdingen (DE); Thomas Schulte, Stuttgart (DE); Uwe Glanz, Asperg (DE); Erhard Hirth, Ellhofen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/492,695

(22) PCT Filed: Sep. 30, 2002

(86) PCT No.: PCT/DE02/03699

§ 371 (c)(1),
(2), (4) Date: Sep. 21, 2004

(87) PCT Pub. No.: WO03/034446

PCT Pub. Date: Apr. 24, 2003

(65) Prior Publication Data

US 2005/0029012 A1  Feb. 10, 2005

(30) Foreign Application Priority Data

Oct. 13, 2001  (DE) ............................. 101 50 715

(51) Int. Cl.
*H01B 17/58* (2006.01)

(52) U.S. Cl. .................. 174/169; 174/167; 174/172; 174/174; 174/265

(58) Field of Classification Search ............... 428/210; 174/167–169, 172–174, 265; 172/172
See application file for complete search history.

(56) References Cited

U.S. PATENT DOCUMENTS

| | | | | |
|---|---|---|---|---|
| 3,006,069 A | * | 10/1961 | Rhoads et al. | 228/124.1 |
| 3,077,511 A | | 2/1963 | Ebling, Jr. et al. | |
| 3,436,109 A | * | 4/1969 | Loose | 403/29 |
| 3,901,772 A | * | 8/1975 | Guillotin et al. | 205/114 |
| 3,922,777 A | | 12/1975 | Weitze et al. | |
| 4,675,788 A | * | 6/1987 | Breitling et al. | 361/792 |
| 5,139,851 A | * | 8/1992 | Acocella et al. | 428/209 |
| 5,169,310 A | | 12/1992 | Chance et al. | |
| 5,368,220 A | * | 11/1994 | Mizuhara et al. | 228/124.5 |
| 5,576,518 A | * | 11/1996 | Shibuya et al. | 174/264 |

(Continued)

FOREIGN PATENT DOCUMENTS

DE      23 06 236      8/1974

(Continued)

*Primary Examiner*—Cathy F. Lam
(74) *Attorney, Agent, or Firm*—Kenyon & Kenyon LLP

(57) ABSTRACT

A green ceramic insert having a green ceramic body provided with a recess extending through the ceramic body is provided, the recess being filled with a paste which may be converted into an electrical plated hole. A ceramic insert made from a sintered green ceramic insert of this type is also described. In addition, a ceramic green body or a green body composite is provided, which has at least one recess in some areas, into which one of the described green ceramic inserts is inserted. The ceramic insert may be integrally joined to the laminated composite, a conductive paste converted by sintering into a printed conductor being routed on the laminated composite in a manner electrically insulated from it, and electroconductively connecting the top of the laminated composite to its bottom via the electrical plated hole.

18 Claims, 1 Drawing Sheet

U.S. PATENT DOCUMENTS

| | | | |
|---|---|---|---|
| 5,855,711 A * | 1/1999 | Araki et al. | 156/89.16 |
| 6,221,513 B1 * | 4/2001 | Lasater | 428/629 |
| 6,432,239 B1 * | 8/2002 | Mandai et al. | 156/89.12 |
| 6,920,051 B1 * | 7/2005 | Figueroa et al. | 361/763 |

FOREIGN PATENT DOCUMENTS

| | | |
|---|---|---|
| DE | 197 42 072 | 3/1999 |
| JP | 51-98700 | 8/1993 |

* cited by examiner

GREEN CERAMIC INSERT, CERAMIC INSERT, CERAMIC GREEN BODY OR GREEN BODY COMPOSITE AND CERAMIC LAMINATED COMPOSITE PRODUCED THEREBY

FIELD OF THE INVENTION

The present invention relates to ceramic inserts, bodies and composites.

BACKGROUND INFORMATION

In the manufacture of planar exhaust gas analyzer probes, such as customary lambda sensors based on thick-film technology, electrically insulated plated holes known as vias are used to connect, for example, printed conductors on different sensor levels or the front or back of a ceramic laminated composite.

If the material from which the ceramic green films are made is electrically insulating, e.g., an LTCC ceramic based on $Al_2O_3$ (where "LTCC" denotes a low-temperature co-fired ceramic), a hole is drilled or punched into the ceramic green film and filled with a paste filled with a conductive material such as silver or platinum, as is customary in the manufacture of printed conductors.

It is more difficult to produce an insulated plated hole, which is suitable for electrically poorly conductive film materials such as yttrium-stabilized zirconium dioxide.

In order to be able to implement an electrical plated hole in the case of ceramic green films containing yttrium-stabilized zirconium dioxide, from which an yttrium-stabilized zirconium dioxide ceramic is produced after sintering, the use of a platinum-containing paste, to which niobium oxide ($Nb_2O_5$) is added, has been described. The latter is able to compensate the yttrium oxide doping of the zirconium dioxide, resulting in a stoichiometry of the ion conductor "yttrium-stabilized zirconium dioxide" in the area of the via or the electrical plated hole, which is characterized by a relatively low electrical conductivity.

An additional technique for integrating electrically insulated plated holes in conductive, ceramic multilayered structures is to introduce a hole for the electrical plated hole into the green film(s), and then to coat or to wet this hole on the wall of the green film(s) delimiting the hole with an insulation paste and then to introduce the conductive material, i.e., the platinum-filled paste, for example, into the now insulated hole.

A disadvantage of the above-described method for producing the plated hole and of the previously produced plated holes is that at high temperatures, the $Nb_2O_5$ counter-doping is made partially ineffective so that the insulation resistance to the electrical plated hole is significantly reduced. Furthermore, the suction of two different pastes, first an insulation paste and then a conductive paste is very difficult, in particular in a multilayered composite of ceramic green films or a ceramic laminated composite (manufactured from it by sintering) because it is hardly possible to ensure that the insulation layer applied first to the inner walls is entirely free from cracks and thus reliably prevents the conductive paste from contacting the electrically conductive ceramic green films and the ceramic layers sintered from it.

Moreover, the insulating effect of known insulated plated holes is generally low at high temperatures in particular because insulating layers used previously have only low layer thicknesses due to their method of manufacture.

As a whole, it has thus far not been possible to ensure a reliable, high-resistivity insulation of a via using a ceramic laminated composite or a ceramic layer at high temperatures of use.

SUMMARY OF THE INVENTION

In contrast to the related art, the green ceramic insert of the present invention, the ceramic insert sintered from it, the ceramic green body or ceramic green body composite of the present invention having a green ceramic insert of this type and the ceramic laminated composite manufactured from it by sintering have the advantage that it is possible to use them to achieve a very reliable, safe and high-quality electrical insulation in the area of an electrical plated hole or via in ceramic layers or ceramic laminated composites even for high-temperature applications and in the event of a plurality of plated hole planes.

It is advantageous in particular if the green ceramic insert has a prismatic, rectangular or cylindrically shaped ceramic body having a round or ellipsoid cross-section when viewed from the top, a recess being placed in it concentrically, traversing it in particular, which is filled with a customary paste which is convertible into the electrical plated hole by sintering, for example.

In order to ensure optimum electrical insulation of the electrical plated hole in relation to the adjacent areas of the ceramic green body or laminated composite, which is at least in some areas made of yttrium-stabilized zirconium dioxide, for example, it is advantageous if the green ceramic body is convertible by sintering, for example, into an electrically or poorly conductive or non-conductive ceramic, for example, a ceramic made essentially from $Al_2O_3$, in relation to the electrical plated hole and also to the ceramic laminated composite present in its surroundings after sintering.

The paste filled into the green ceramic insert in the area of the recess may be filled with an electrically conductive material such as platinum or aluminum. This paste may be filled into the recess in the green ceramic body in such a way that at least on one side, or both sides, it projects from the green ceramic body or surmounts it in the area of the outlet orifices of the recess, so that, in a subsequent method step, it is possible to connect these projecting paste areas with a conductive paste, pressed on the top and/or the bottom and structured in particular as printed conductors, in a particularly simple and reliable manner.

The dimensions of the recess in the ceramic body may be 50 mm to 2 mm in diameter at a diameter of the green ceramic body of between 0.5 mm to 5 mm.

It is further very advantageous in particular if the ceramic green body or the composite of ceramic green bodies, into which the green ceramic insert is or will be inserted, has a recess, which is dimensioned to match as exactly as possible the shape of the green ceramic insert or is slightly larger, and which simultaneously connects the top of the green body or green body composite with the bottom of the green body or green body composite. In this connection, it is further advantageous if the material of the green ceramic insert is matched to the material of the surrounding ceramic green body or green body composite in such a way that after insertion, the material of the green ceramic insert expands somewhat within the recess during sintering and is thus secured in the recess, i.e., solidly anchored there. In particular, this ensures that the green ceramic insert is integrally joined to the surrounding green body or ceramic green body composite, the conductive paste converted by the sintering into a printed conductor or structured conducting surface simultaneously electrically conductively connecting the top of the ceramic laminated composite to its bottom.

The slight expansion of the material of the green ceramic insert produces both a solid, precisely fitting seat in the recess in the ceramic green body or ceramic green body composite and also brings about a certain manufacturing tolerance.

In order to improve the bond or the seat of the inserted green ceramic insert in the ceramic green body or green body composite in the area of the recess introduced in it, it is further advantageous if the inside of the recess in the ceramic green body or green body composite is additionally coated at least in some areas with a binder paste or a slurry, such as a customary film binder paste before the green ceramic insert is inserted.

In order to be able to route printed conductors or structured conducting surfaces produced on or also in the ceramic green body or green body composite or the ceramic laminated composite produced from it after sintering from it to the produced electrical plated hole so that they are electrically insulated, it is advantageous if the top and bottom of the ceramic green body or green body composite or at least individual ceramic green films constituting it are provided on at least one side, on both sides in particular, and at least in some areas with an additional green ceramic insulating layer, which after sintering is converted into ceramic insulating layers based, for example, on $Al_2O_3$.

DETAILED DESCRIPTION

In a first exemplary embodiment explained with reference to FIGS. 1a through 1d, an electrical plated hole is at first produced as an inlay separate from a ceramic green film, which is convertible by sintering, for example, into a highly insulating material such as $Al_2O_3$, a recess located within this inlay being filled with a paste before sintering, the recess being converted by sintering into the electrical plated hole. The inlay is then inserted in the form of a plug into a, for example, predrilled or prepunched hole in a ceramic green film or even in a green film composite, after which printed conductors are then further printed onto the top or the bottom of the ceramic green film before the overall structure thus produced is then finally sintered into a ceramic laminated composite.

Figure 1A:
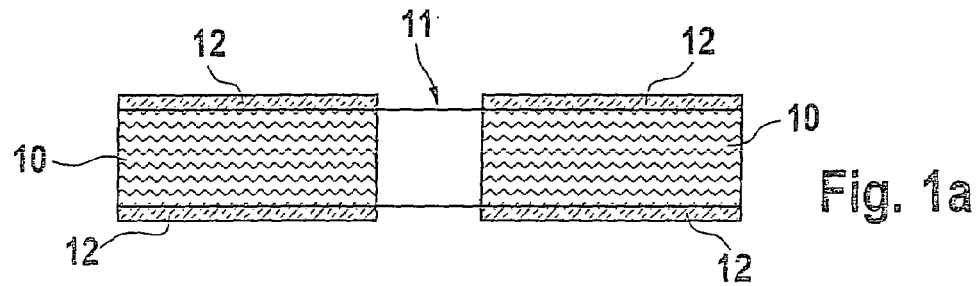
FIGS. 1a through 1d show cross-sectional views corresponding to different method steps for manufacturing a ceramic green body having an inserted green ceramic insert according to an embodiment of the present invention.

FIG. 1a shows a ceramic green film 10 based on yttrium-stabilized zirconium dioxide, both sides of which are provided with a thin green ceramic insulating layer or insulating film 12, which is convertible by sintering into an $Al_2O_3$ ceramic. In addition, a recess 11 in the form of a cylindrical hole has been introduced in ceramic green film 10. Recess 11 may be introduced into green film 10 both after the application of insulating layers 12 onto green film 10 as well as before their application.

Figure 1B:
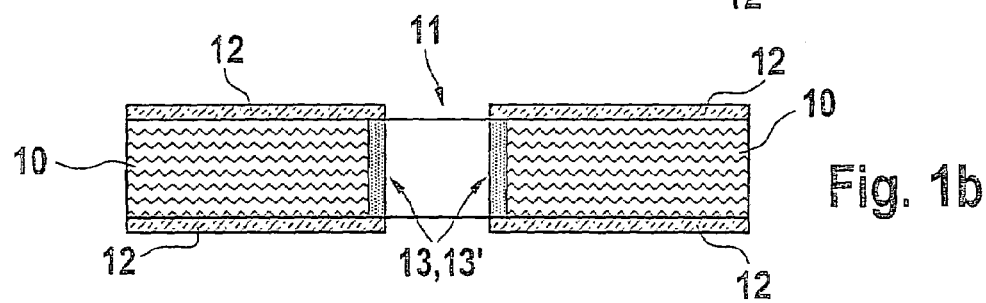

FIG. 1b shows the interior walls 13 of green film 10 are coated with a film binder paste 13' in the area of recess 11 in a subsequent method step.

Figure 1C:
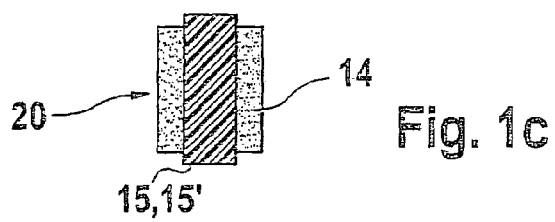

FIG. 1c shows how a green ceramic insert 20 is produced concurrent with or before or after method steps 1a or 1b, the size of it being matched to the size of recess 11 or having a slightly smaller diameter. Corresponding to recess 11, green ceramic insert 20 is cylindrical and has a continuous recess 15 in the form of a hole having a circular cross-section, which is surrounded by a similarly cylindrical green ceramic body 14.

Green ceramic body 14 is, for example, punched out from a ceramic green film, which is convertible by sintering into an electrically highly insulating ceramic, an $Al_2O_3$ ceramic, for example.

Subsequently, recess 15 traversing green ceramic body 14 is filled with a paste 15', which contains an electrically conductive material such as platinum or aluminum and is convertible by sintering into an electrical plated hole.

According to FIG. 1c, paste 15' slightly surmounts ceramic body 14 on both sides.

Figure 1D:
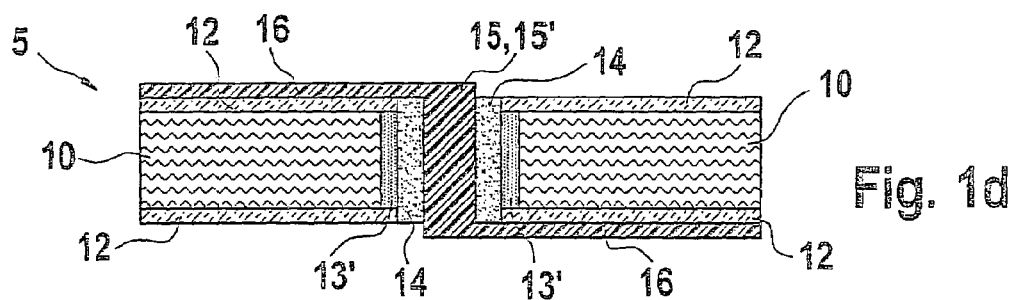

FIG. 1d shows the further method steps, green ceramic insert 20 according to FIG. 1c having been inserted into recess 11 according to FIG. 1b, and subsequently a conductive paste 16, which is known, in the form of printed conductors or conductive layers having been pressed in some areas onto the top or the bottom of ceramic green body 5 thus produced. Conductive paste 16 may be identical to paste 15', which forms the electrical plated hole.

Thus on the whole, a ceramic green body 5 is produced according to FIG. 1d, the top being connected to the bottom via an electrical plated hole, which is present in the area of recess 15, this electrical plated hole simultaneously being electrically insulated in relation to green film 10 by green ceramic body 14. Furthermore, conductive paste 16 is insulated in relation to green film 10 by insulation layers 12.

Finally, ceramic green body 5 according to FIG. 1d is sintered, resulting in a ceramic laminated composite.

Moreover, it may be noted that due to the dimensions and the flexibility of ceramic green films 10, 12 used, they normally have adequate stability for the provided method steps so that, for example, green ceramic insert 20 is inserted into recess 11 without any particular difficulty with respect to process engineering.

Figure 2:
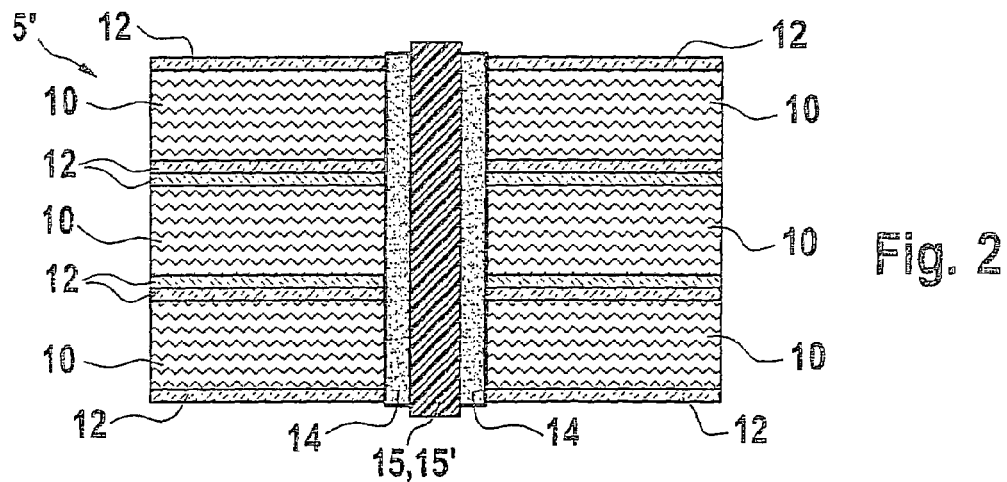
FIG. 2 shows an alternative exemplary embodiment of the ceramic green body.

FIG. 2 shows a second exemplary embodiment in which a composite of ceramic green bodies or a green film stack 5' is shown, which is made up of a plurality of individual ceramic green films 10, each having insulation layers 12 according to FIG. 1b applied to both surfaces of the green film.

In this case also, a green ceramic insert 20 according to FIG. 1c is inserted into ceramic green body composite 5', the green ceramic insert now corresponding to the height of the ceramic green body composite 5' or is sized corresponding to recess 11 according to FIG. 1b.

On the whole, after final sintering of composite of ceramic green films 5' according to FIG. 2, an electrical plated hole is obtained in a ceramic laminated composite, which presses through a plurality of film layers simultaneously. Moreover, pressed-on, structured conductive paste 16 according to FIG. 1d, which is present there, is not shown in FIG. 2 for reasons of clarity.

What is claimed is:

1. A green ceramic insert, comprising:
    a green ceramic body including a recess, the recess traversing the green ceramic body and filled with a paste that is convertible into an electrical plating, wherein the green ceramic body includes at least one of:
    aluminum oxide, and
    a material that is substantially convertible into a ceramic aluminum oxide body by sintering.

2. The green ceramic insert of claim 1, wherein the green ceramic body is converted into a ceramic by sintering, the ceramic being one of electrically non-conductive and poorly conductive in relation to the electrical plating.

3. The green ceramic insert of claim 1, wherein the ceramic body is cylindrical and has one of a round and ellipsoid cross section when viewed from the top and the recess is centered in the ceramic body.

4. The green ceramic insert of claim 1, wherein the recess is cylindrical and has one of a round and ellipsoid cross section when viewed from the top.

5. The green ceramic insert of claim 4, wherein the recess is stamped out from the green ceramic body.

6. The green ceramic insert of claim 1, wherein the paste includes an electrically conductive material and is inserted into the recess of the ceramic body such that the paste extends beyond at least one surface of the ceramic body.

7. The green ceramic insert of claim 6, wherein paste includes at least one of platinum and aluminum, the recess includes an outlet orifice at each end, and the paste extends beyond at least one of the outlet orifices of the recess.

8. The green ceramic insert of claim 1, wherein the recess has a diameter between approximately 50 µm to 2 mm.

9. The green ceramic insert of claim 1, wherein the green ceramic body has a diameter between approximately 0.5 mm to 5 mm.

10. A ceramic insert, comprising:
a sintered green ceramic body including a recess, the recess traversing the green ceramic body and filled with a paste that is convertible into an electrical plating, wherein the green ceramic body includes at least one of aluminum oxide and a material that is substantially convertible into a ceramic aluminum oxide body by sintering.

11. A ceramic green body, comprising:
a body section; and
at least one recess situated within the body section, the at least one recess including a green ceramic insert having a further recess, the further recess traversing the green ceramic insert and filled with a paste that is convertible into an electrical plating, wherein the body section of the ceramic green body includes yttrium-stabilized zirconium dioxide.

12. The ceramic green body of claim 11, wherein the at least one recess is one of configured to match the shape of the green ceramic insert and slightly larger than the green ceramic insert, and extends from a top of the ceramic green body to a bottom of the ceramic green body.

13. The ceramic green body of claim 11, further comprising:
one of a binder paste and a slurry at least partially coating an interior surface of the at least one recess within the body section.

14. The ceramic green body of claim 13, wherein the interior surface is completely coated with one of the binder paste and the slurry.

15. The ceramic green body of claim 11, wherein the body section includes a green ceramic insulating layer on at least one side.

16. The ceramic green body of claim 15, wherein the body section is completely covered on top and bottom sides with the green ceramic insulating layer.

17. The ceramic green body of claim 16, wherein a conductive paste configured as a flat printed conductor is situated on a section of at least one of a top and a bottom surface of the ceramic green body, the conductive paste being in contact with the paste filled into the further recess of ceramic green body.

18. The ceramic green body of claim 17, wherein the conductive paste is separated from the ceramic green body by the green ceramic insulating layer.

* * * * *